United States Patent [19]

Hwang

[11] Patent Number: 5,786,264
[45] Date of Patent: Jul. 28, 1998

[54] METHOD OF FORMING ISOLATION LAYER OF SEMICONDUCTOR ELEMENTS

[75] Inventor: Hyon-Sang Hwang, Daejon, Rep. of Korea

[73] Assignee: LG Semicon Co., Ltd., Choongcheongbuk-Do, Rep. of Korea

[21] Appl. No.: 770,154

[22] Filed: Dec. 19, 1996

[30] Foreign Application Priority Data

Dec. 29, 1995 [KR] Rep. of Korea ............... 67326/1995

[51] Int. Cl.⁶ ..................................................... H01L 21/76
[52] U.S. Cl. ............................. 438/443; 438/297; 438/452
[58] Field of Search ............................ 438/443, 452, 438/297, 439

[56] References Cited

U.S. PATENT DOCUMENTS 5,049,520  9/1991  Cathey ........................... 438/443
5,134,089  7/1992  Barden .......................... 438/443
5,332,682  7/1994  Lowrey .......................... 438/443
5,455,438  10/1995  Hashimoto et al. ............ 257/391

OTHER PUBLICATIONS

Andes Bryant, et al., The Current–Carrying Corner Inherent to Trench Isolation, IEEE Electron Device Letters, vol., 14, No. 8, pp. 412–414, Aug. 1993.

*Primary Examiner*—Trung Dang
*Attorney, Agent, or Firm*—Morgan, Lewis & Bockius LLP

[57] ABSTRACT

A method of forming an isolation layer of a semiconductor device, comprising the steps of defining a semiconductor substrate with a cell region and a peripheral region; forming a first buffer layer on the peripheral region of the semiconductor substrate; forming a second buffer layer on the cell region of the semiconductor substrate and on the first buffer layer; forming an anti-oxidation layer on the second buffer layer to define an active region; and forming a field insulation layer in the cell and peripheral regions of the substrate by oxidation.

7 Claims, 3 Drawing Sheets

5,786,264

METHOD OF FORMING ISOLATION LAYER OF SEMICONDUCTOR ELEMENTS

BACKGROUND OF THE INVENTION

1. Field of the Invention

The present invention relates to a method of forming an isolation layer in semiconductor devices, and particular to a method of forming an isolation layer in semiconductor devices, by which the isolation layer is formed after making the thickness of a buffer film different in a cell region and a peripheral region on a semiconductor substrate.

2. Description of the Conventional Art

FIG. 1 shows schematically a conventional method of forming an isolation layer in a semiconductor device, the manufacturing process of which is described in the following.

In FIG. 1A, a pad oxide layer 2 is deposited on the surface of a semiconductor substrate 1, and a nitride layer 3 is deposited with thickness of about 1900 Å and then the nitride layer 3 is patterned to define cell and peripheral regions in the nitride layer 3 by means of photolithography.

In FIG. 1B, a field oxide layer 4 is formed on the semiconductor substrate 1 on which the pad oxide layer 2 is exposed, through a field oxidation process.

In FIG. 1C, the nitride layer 3 in the cell and peripheral regions is removed by etching, and the field oxide layer 4 is subjected to a recess etching.

In the method of forming the isolation layer of semiconductor elements, the pad oxide and nitride layers are deposited simultaneously on the surface of the semiconductor wafer, and the thickness thereof is identical with each other. In case of 256M DRAM elements, the nitride/oxide layer ratio is increased to 15:1 or more to secure the active margin of the cell-transistor, and the field oxide layer is recessed after carrying out the field oxidation. The reference sign A represents the recess region.

It is known from a recently published article (IEEE ELECTRON DEVICES LETTERS, Vol. 14 1993, p. 412), that when a field oxide layer is recessed, a parasitic transistor in a corner is turned on, and a hump characteristic is generated in the current-voltage (I–V) curve.

According to the conventional method of forming the isolation layer of semiconductor elements, the cell transistor has so high a threshold voltage (Vth) that there is no difficulty even when a hump occurs in the current-voltage curve, but if a hump occurs in the current-voltage curve of a parasitic transistor, a leakage current is produced in an OFF-state (Vg=0V). There is particularly a problem that if the threshold voltage Vth drops down to 0.5V or less in a 256M DRAM, the power loss becomes serious due to a leakage current caused by such bump, and it is impossible to apply 256M DRAM, etc. devices.

SUMMARY OF THE INVENTION

The present invention is devised to eliminate problems raised in the conventional method of forming the isolation layer of semiconductor elements, and it is the object of the present invention to provide a method of forming the isolation layer of semiconductor elements, by which a field oxide layer is formed by making the thickness of a buffer layer different in the cell and peripheral regions on the semiconductor substrate, so as to reduce an occurrence of leakage current in the peripheral region.

In order to attain the above object, a preferred embodiment of the present invention comprising the steps of defining a semiconductor substrate with a cell region and a peripheral region; forming a first buffer layer on the peripheral region of the semiconductor substrate; forming a second buffer layer on the cell region of the semiconductor substrate and on the first buffer layer; forming an anti-oxidation layer on the second buffer layer to define an active region; and forming a field insulation layer in the cell and peripheral regions of the substrate by oxidation.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

FIGS. 2A through 2D show the method of forming the isolation layer in the cell and peripheral regions of a semiconductor element according to the present invention.

Figure 1A:
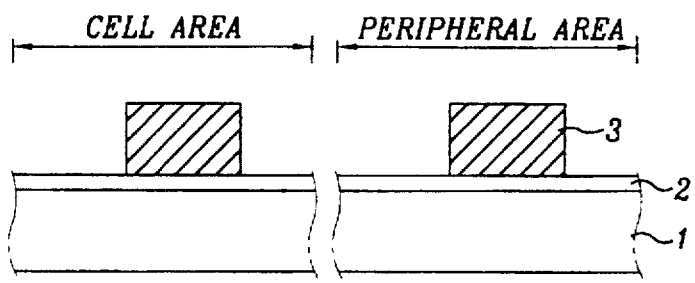
FIGS. 1A through 1C show the conventional method of forming an isolation layer of semiconductor elements.
Figure 1B:
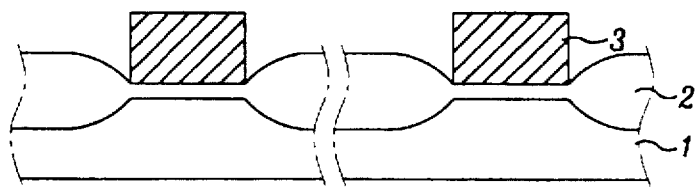
Figure 1C:
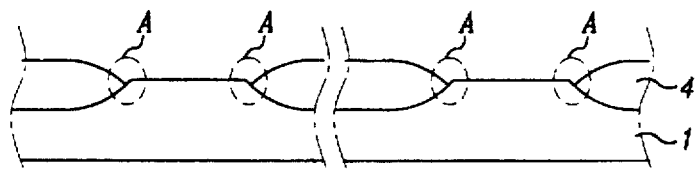
Figure 2A:
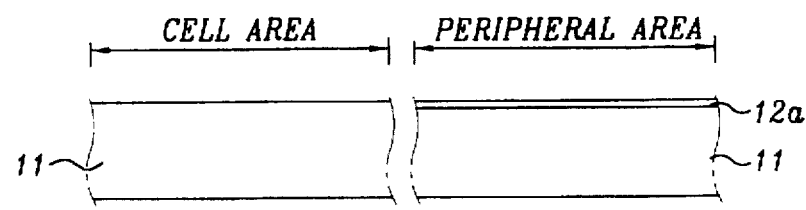
FIGS. 2A through 2D show the method of forming the isolation layer of semiconductor elements according to the present invention.

In FIG. 2A, a first pad oxide layer 12a which is the first buffer layer is grown with a thickness of about 100 Å on the semiconductor substrate 11, and the cell region on the semiconductor substrate 11 is opened by a photolithography process.

Subsequently, the first pad oxide layer 12a in the cell region on the semiconductor substrate 11 is removed by means of a wet etching, and then the semiconductor substrate is cleaned.

Figure 2B:
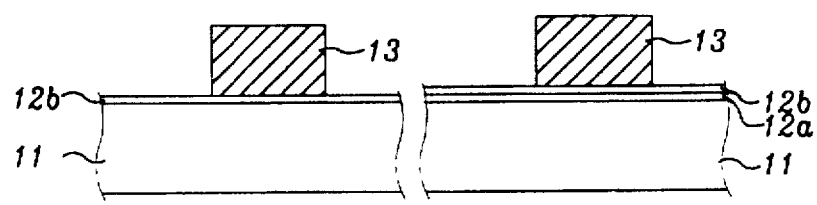

In FIG. 2B, a second pad oxide layer 12b which is the second buffer layer, is grown to a thickness of 100 Å in the cell region and on the first buffer layer 12a. The thickness of the buffer layers consisting of the first and second buffer layers 12a, 12b formed in the peripheral region, is about 150 Å.

Subsequently, a nitride layer ($Si_3N_5$) as an anti-oxidation layer is deposited to a thickness of about 1900 Å on the second buffer layer 12b corresponding to the active region, and after defining the nitride layer 13b by means of a photolithography process, and pattern of the nitride layer 13 is formed on the cell and peripheral regions.

Figure 2C:
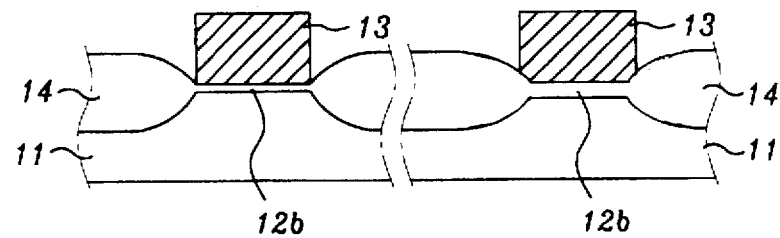

In FIG. 2C, a field oxide layer 14 is formed by a field oxidation of the semiconductor substrate 11 on which the nitride layer is formed. The bird's beak of the field oxide layer 14 is formed thicker in the peripheral region.

Figure 2D:
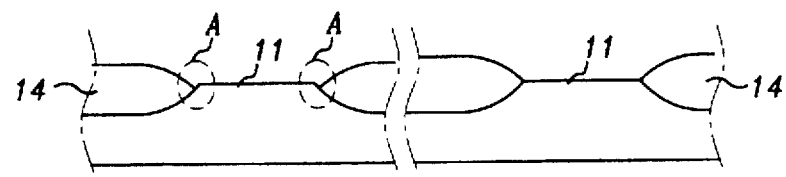

In FIG. 2D, the pad oxide layer 13 is removed by etching, and then the first and second pad oxide layers 12a, 12b are removed by etching. In this case, the field oxide layer 14 is etched as much as the thickness of the first and second pad oxide layers 12a, 12b, and there is formed no recess at both edges of the field oxide layer of the periphery of the bird's beak which is thicker than that in the cell region, while there is formed a recess A at both edges of the field oxide layer of the cell region.

In the Figure, the field oxide layer 14 has a bird's beak region expanding into the active region, and the width of the bird's beak region in the peripheral region is larger than that of the bird's beak in the cell region.

Figure 3:
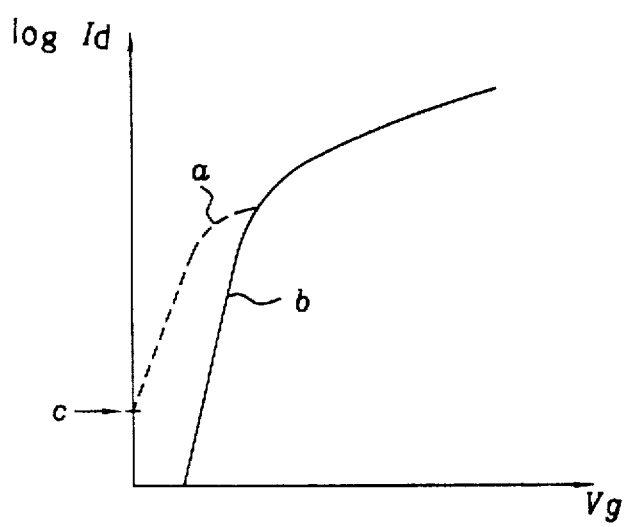
FIG. 3 is a graph showing the current-voltage characteristics of the semiconductor elements.

FIG. 3 is a graph showing the current-voltage characteristics of semiconductor elements according to the present invention, wherein "a" represents a conventional semiconductor element; "b", a semiconductor element according to the present invention; and "c", the leakage current in an off-state; respectively. As shown in FIG. 3, the semiconductor element according to the present invention produces no leakage current in an off-state.

As described above, it is possible, by the method of forming the isolation layer of semiconductor elements according to the present invention, to eliminate the leakage current in an off-state of transistors in the peripheral region, by providing the cell and peripheral regions with a different thickness of the pad oxide layer, and to apply such semiconductor elements for low power devices owing to a reduction of power consumption.

Since the threshold voltage of the transistor in the cell region is high, the leakage current is not impeded, even when a bump is generated on the current-voltage curve, and in case of a transistor in the cell region having a narrow width, it has particularly the effect of increasing the drive current.

In the above embodiment, even when the thickness of the pad oxide layer is made identical in the cell and peripheral regions, and the nitride layer is made thicker only in the cell-transistor, the characteristics of the semiconductor elements according to the present invention are maintained.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method of forming an isolation of a semiconductor device, comprising the steps of:

defining a semiconductor substrate with a cell region and a peripheral region;

forming a first buffer layer on the peripheral region of the semiconductor substrate;

forming a second buffer layer on the cell region of the semiconductor substrate and on the first buffer layer, the second buffer layer having a thickness greater than the first buffer layer;

forming an anti-oxidation layer on the second buffer layer to define an active region and an isolation region;

forming a field oxide layer in the cell and peripheral regions of the substrate by oxidation, the field oxide layer having first and second bird's beak regions in the cell and peripheral regions, respectively;

removing the anti-oxidation layer after forming the field oxide layer; and completely removing the first and second bird's beak regions to form recesses at both edges of the field oxide layer of the cell region.

2. The method of claim 1, wherein the step of forming the field oxide layer comprises:

forming an oxide layer on the isolation region of the semiconductor substrate by carrying out an oxidation process after forming the anti-oxidation layer, the oxide layer having a bird's beak region expanding into the active region, a width of the bird's beak region in the peripheral region being larger than a width of the bird's beak region in the cell region.

3. The method of claim 1, wherein the steps for forming the first and second buffer layers comprises:

a step for forming the first oxide layer as the first buffer layer on the semiconductor substrate by means of a thermal oxidation;

a step for removing the first buffer layer on the semiconductor substrate corresponding to the cell region; and a step for forming the second oxide layer by a thermal oxidation on the semiconductor substrate in the cell region and on the first buffer layer of the peripheral region.

4. The method of claim 3, wherein a thickness of the second oxide layer is 50–100 Å and the sum of the thicknesses of the first and second oxide layers in the peripheral region is 50–300 Å.

5. The method of claim 1, wherein the anti-oxidation layer pattern comprises a nitride layer.

6. The method of claim 5, wherein a thickness of the nitride layer is 1000–3000 Å.

7. The method of claim 1, wherein the step of completely removing the first and second bird's beak regions is performed by a wet etching process.

* * * * *